United States Patent
Acosta et al.

(10) Patent No.: US 6,242,321 B1
(45) Date of Patent: Jun. 5, 2001

(54) STRUCTURE AND FABRICATION METHOD FOR NON-PLANAR MEMORY ELEMENTS

(75) Inventors: Raul Edmundo Acosta, White Plains; James Hartfiel Comfort, New City; Alfred Grill, White Plains; David Edward Kotecki, Hopewell Junction; Katherine Lynn Saenger, Ossining, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/303,595

(22) Filed: May 3, 1999

Related U.S. Application Data

(60) Continuation-in-part of application No. 08/899,099, filed on Jul. 24, 1997, now abandoned, which is a division of application No. 08/636,624, filed on Apr. 23, 1996, now Pat. No. 5,757,612.

(51) Int. Cl.[7] .................................................. H01L 21/76
(52) U.S. Cl. .......................................... 438/424; 438/393
(58) Field of Search ...................... 438/115, 387, 438/393, 396, 398, 253, 400, 424, 622, 627, 637, 236; 361/321.4, 312, 313, 301.4, 321.2; 257/303, 304, 310, 306

(56) References Cited

U.S. PATENT DOCUMENTS

| | | | |
|---|---|---|---|
| 5,081,559 | 1/1992 | Fazan et al. | 361/313 |
| 5,122,477 | 6/1992 | Wolters et al. | 438/195 |
| 5,142,437 | 8/1992 | Kammerdiner et al. | 361/313 |
| 5,335,138 | 8/1994 | Sandu et al. | 361/303 |
| 5,389,566 | 2/1995 | Lage | 438/60 |
| 5,408,130 | 4/1995 | Woo et al. | 257/758 |
| 5,466,636 | * 11/1995 | Cronin et al. | 437/187 |
| 5,619,393 | 4/1997 | Summerfelt et al. | 361/313 |
| 5,825,609 | * 10/1998 | Andricacos et al. | 361/321.4 |

* cited by examiner

*Primary Examiner*—Matthew Smith
*Assistant Examiner*—Robert G. Hullinger
(74) *Attorney, Agent, or Firm*—Scully, Scott, Murphy & Presser; Robert M. Trepp, Esq.

(57) ABSTRACT

Structures for memory cell applications, including capacitors for DRAM and ferroelectric memory cells from FRAM, whose method of manufacture consists of depositing a ferroelectric or high-epsilon dielectric material to completely fill a cavity whose geometrical width is the sole determinant of the thickness of the electrically active portion of the ferroelectric or high-epsilon dielectric layer in the final device. In the preferred embodiment, the cavity into which the dielectric is deposited is defined by the gap between the plate and stack electrodes which are deposited and patterned in a through-mask plating step prior to the dielectric deposition.

15 Claims, 6 Drawing Sheets

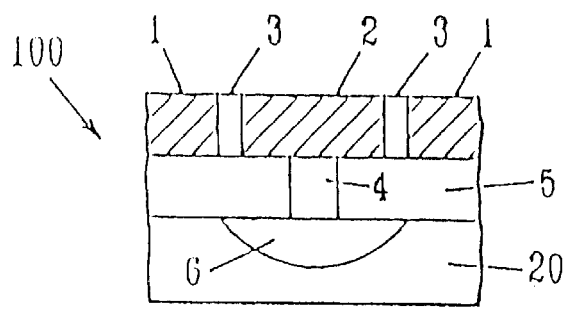
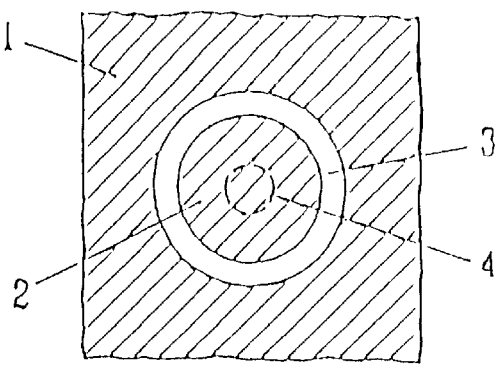
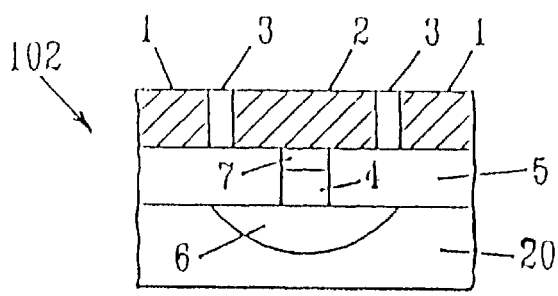
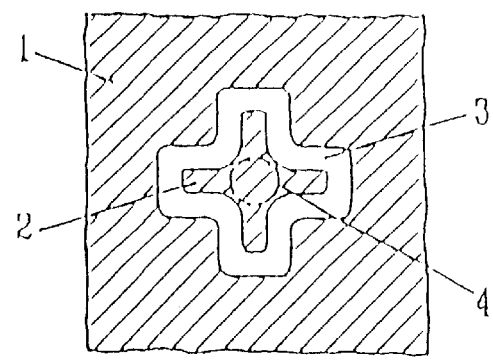
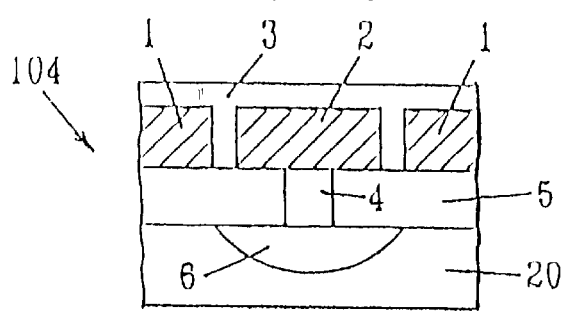
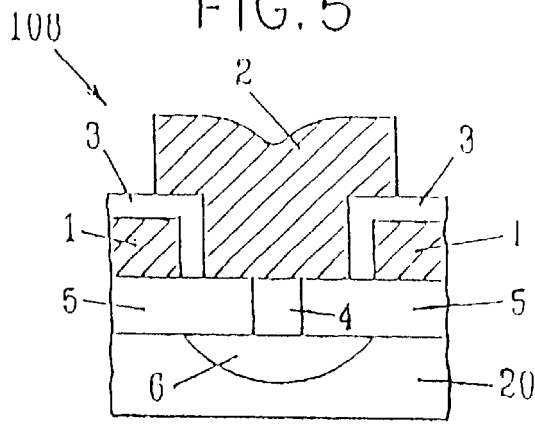
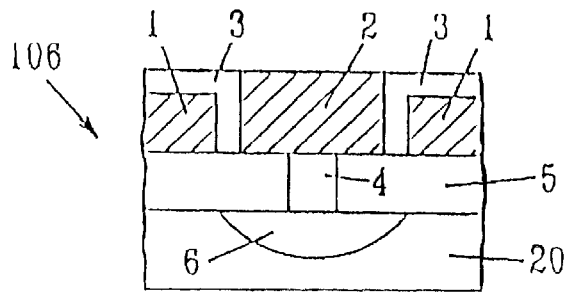

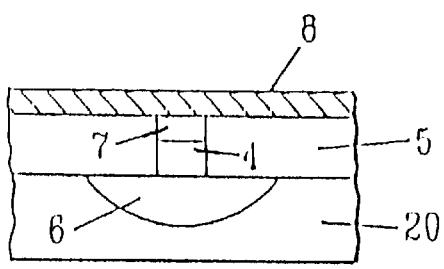
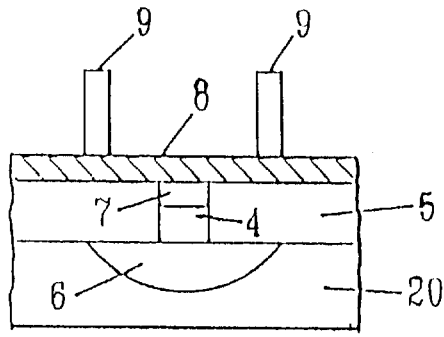
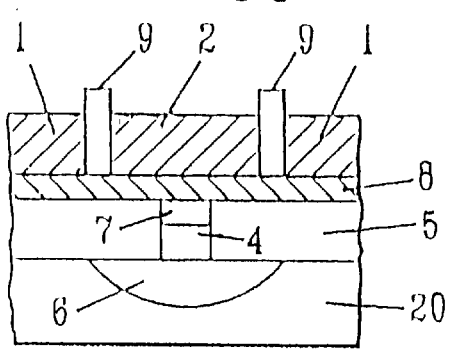
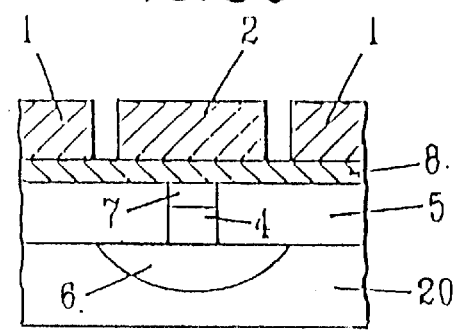
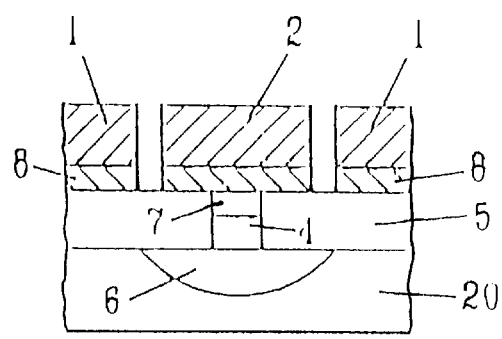
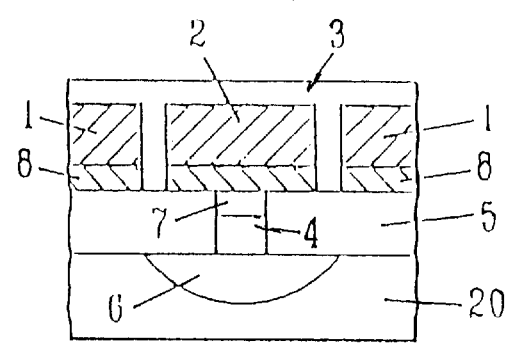
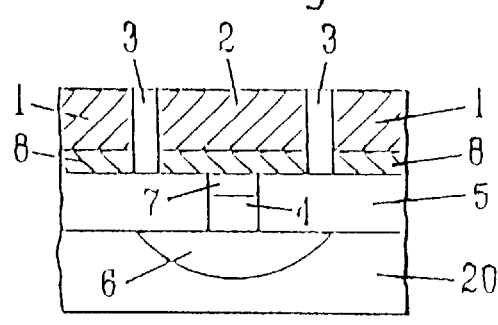

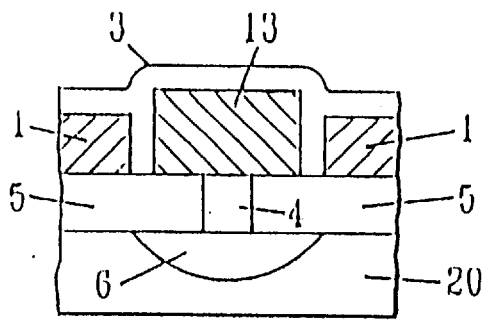
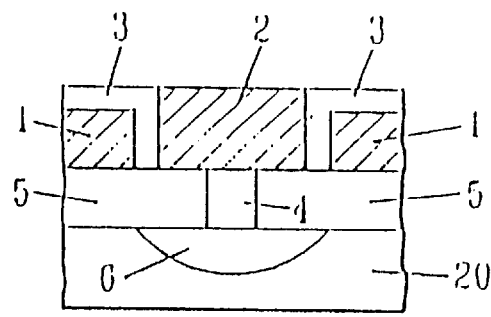
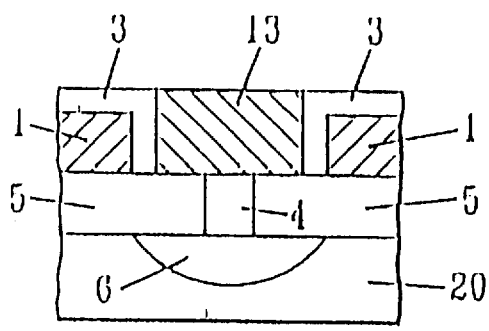
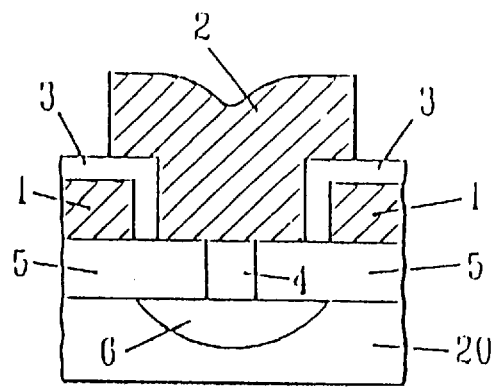
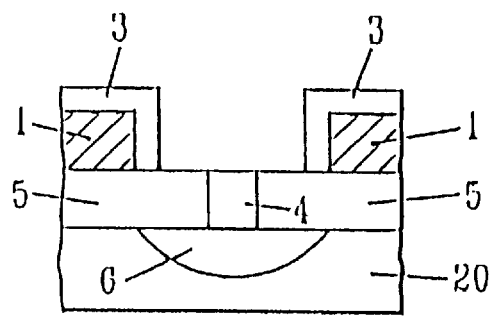

US 6,242,321 B1

STRUCTURE AND FABRICATION METHOD FOR NON-PLANAR MEMORY ELEMENTS

RELATED APPLICATIONS

This application is a continuation-in-part application of application Ser. No. 08/899,099, filed Jul. 24, 1997, now abandoned, which is a divisional application of U.S. Ser. No. 08/636,624, filed Apr. 23, 1996, now U.S. Pat. No. 5,757,612.

FIELD OF THE INVENTION

This invention pertains to two fabrication methods for forming the dielectric structures in non-planar capacitors and ferroelectric memory cells, and to memory device structures utilizing these fabrication methods.

BACKGROUND OF THE INVENTION

The incorporation of high dielectric constant materials into small geometry capacitors suitable for Gigabit scale DRAM introduces fabrication challenges relating to topography, electrode material patterning, reaction of high-epsilon materials with Si contact and ultimate density/scalability. Similar challenges pertain to the fabrication of ferroelectric memory cells for ferroelectric RAM (FRAM) and other non-volatile RAM (NVRAM). To date, most fabrication strategies for making non-planar memory cells (a category of devices including both capacitors or "dielectric memory cells" and ferroelectric memory cells) is that the dielectric or ferroelectric deposition process be a conformal one which leaves a uniformly thin coating of film over all features of the sample topography. This requirement for a conformal process (such as chemical vapor deposition) tends to limit the use of promising spin-on deposition techniques (such as sol-gel) which have a tendency to gap fill and planarize.

An example of a fabrication method incorporating a sol-gel deposited cell dielectric into a three-dimensional memory device is found in U.S. Pat. No. 5,081,559, issued on Jan. 14, 1992 to Fazan et al. In this method, two electrodes are formed sequentially, prior to sol-gel deposition of the cell dielectric material, and the gap defined by a disposable sidewall spacer.

SUMMARY OF THE INVENTION

This invention describes two fabrication methods for making non-planar capacitors and ferroelectric memory cells, and memory device structures utilizing these fabrication methods. A key feature of these fabrication methods is that the ferroelectric or high-epsilon dielectric material is deposited to completely fill a cavity whose geometrical width is the sole determinant of the thickness of the electrically active portion of the ferroelectric or high-epsilon dielectric layer in the final device. In a first embodiment, the cavity into which the dielectric is deposited is defined by the gap the plate and stack electrodes which are deposited and patterned in a through-mask plating step prior to the deposition of the memory cell dielectric or ferroelectric. This embodiment differs from typical memory cell designs in which at least one of the electrodes is put on after the dielectric or ferroelectric layer. Use of the invention makes it possible, for example, to build non-planar capacitors using relatively inexpensive and more easily developable dielectric deposition processes such as sol-gel. This is particularly advantageous when conformal deposition processes (e.g., CVD) do not exist for the desired dielectric material.

Another advantage of this embodiment of this invention is that pinholes in the dielectric will not lead to shorts between the electrodes, as would be the case if the second electrode were applied to a dielectric layer already in the structure as a coating on the first electrode.

In a second embodiment, the electrode adjacent to the device contact material is deposited after the deposition of the cell dielectric. In this embodiment, (i) the gap filled by the cell dielectric material is first defined by a disposable sidewall spacer, and (ii) the cell dielectric is deposited between the first electrode and a temporary "dummy electrode" which is replaced by the final electrode material after deposition of the cell dielectric. This embodiment has the advantage of minimizing the oxidation and contact material reactions might occur were the final electrode material in place during cell dielectric deposition.

The ferroelectric or high-epsilon dielectric layer structures of the present invention have a thickness that is defined by the width of the cavity or gap into which the dielectric layer is to be deposited. When the dielectric is deposited between the plate and stack electrodes, the electrode height defines the width of the capacitor area, and the perimeter or boundary region between the plate and stack electrodes, which may take any of a number of shapes (circle, oval, hollow cross, etc.), defines the length of the capacitor area.

For an annular capacitor, the effective capacitor area is given by the product of the electrode height and the circumference of the annulus. The dielectric thickness is the same as the gap thickness.

This invention enables the fabrication of non-planar capacitors incorporating dielectrics deposited with nonconformal deposition processes such as sol-gel. This is important because sol-gel processes have a number of advantages over CVD, such as cost, ease of development, and availability for a wider range of dielectric materials. Combined with the electrode fabrication process of the present invention as described below, memory cell fabrication for DRAM, FRAM, and/or NVRAM can be relatively simple and inexpensive.

BRIEF DESCRIPTION OF THE DRAWINGS

FIG. 1(a) cross-sectional view of one embodiment of the capacitor structure of the present invention showing the geometry of first and second electrodes.

FIGS. 1(b) and 1(c) are top views of two variations of the shape of the gap between the first and second electrodes of the structure of FIG. 1(a).

FIG. 2 is a cross-sectional view of another embodiment of the structure of FIG. 1 having an additional barrier layer beneath one of the electrodes.

FIG. 3 is a cross-sectional view of another embodiment of the structure of FIG. 1 having an additional dielectric layer above the first and second electrodes.

FIG. 4 is another embodiment of the structure of FIG. 3 in which the height of one of the electrodes is higher than the other electrode.

FIG. 5 is a cross-sectional view of another embodiment of FIG. 4 having an alternate shape for the second electrode.

FIGS. 6(a)–6(g) are cross-sectional views depicting various stages in one method of fabricating the structures of FIGS. 1–3.

FIGS. 8(a)–8(k) are cross-sectional views depicting various stage in a method of fabricating the structures of FIGS. 4 and 5.

DETAILED DESCRIPTION OF THE INVENTION

Figure 6H:
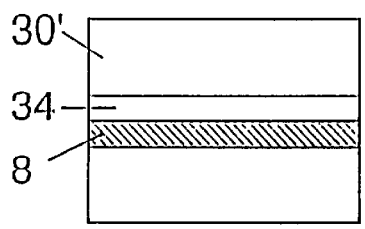
FIGS. 6(h)–6(p) are cross-sectional views depicting various stages in one method of fabricating the inventive structure wherein disposable structures are formed from sidewall spacers deposited on a temporary mandrel layer.
Figure 6I:
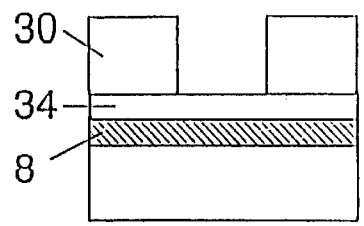
Figure 6J:
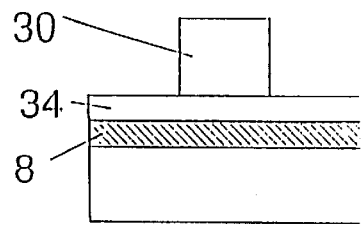
Figure 6K:
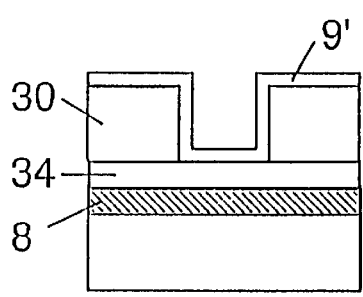
Figure 6L:
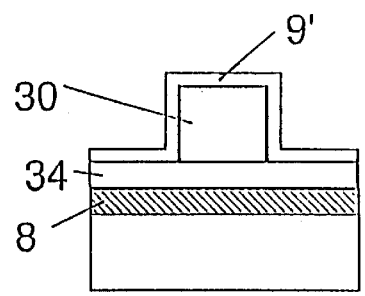

The present invention is directed to a semiconductor electrical device comprising an insulating or semiconducting substrate, a first conductive region formed in the substrate from a first conducting material, and a first dielectric layer formed above the substrate. The first dielectric layer has a first opening or contact via above some portion of said first conductive region. The first opening is substantially filled with a second conductive material to make a "plug." A substantially planar layer is formed above the first dielectric layer, and the substantially planar layer contains separated first and second electrodes, made of a third conductive material.

The first or "plate" electrode surrounds and is isolated from the second or "stack" electrode. The second electrode is positioned over the contact via.

The first and second electrodes are separated from one another by a gap whose width is equal to the spacing of the electrode sidewalls, which are substantially vertical and transverse to the layer of third conductive material. A layer of second dielectric material fills the gaps between the electrodes.

In the fabrication of a memory device, a large number of these devices or memory cells are formed on a single substrate. In the formation of such a memory device, the plate electrodes will be electrically connected to each other, while the stack electrodes will be insulated from each other.

The steps to make the electrical device are such that the second dielectric material is deposited to completely fill a gap whose sidewalls are present when the second dielectric material is being deposited, and whose sidewalls define the width of the second dielectric material in the final structure, and further whose sidewalls may or may not be constructed from the final electrode materials.

In one embodiment of the present invention, the second electrode is made from the third conductive material, and the first electrode is made from a fourth conductive material, where the third and fourth conductive materials may be the same or different. In another embodiment, the first and second electrodes are made from a bilayer of two electrically conductive materials or a multilayer of two or more electrically conductive materials, the layers not necessarily being the same for both electrodes.

The first conductive material consists of the conductive elements of the semiconductor devices in the substrate. The second conductive material may consist of doped polysilicon, tungsten, or any suitable conductive material. The third and fourth electrode materials may be selected from the groups consisting of noble metals (such as Au, Pt, Pd, Ir, Rh), alloys of noble metals with noble or non-noble metals, metals whose oxides are conducting (such as Ru and Mo), electrically conducting oxides (such as $RuO_2$, $IrO_2$, $Re_2O_3$, etc.), nitrides such as TiN or WN, electrically conductive, oxidation-resistant nitrides (such as TaN, TaSiN) and suicides (such as $TaSi_2$). Electrodes being deposited after deposition of the second dielectric material may also be selected from the additional group of electrically conducting materials whose oxides are insulating.

The first dielectric material may substantially consist of $SiO_2$, PSG (phosphosilicate glass), BPSG (borophosphosilicate glass), flowable oxide, spin-on-glass, or other conventional dielectric or combination of these. The second dielectric material is selected from the group consisting of ferroelectric, paraelectric, perovskite, pyrochlores, relaxors, layered perovskites, or any material with a dielectric constant greater than or equal to 20. Examples of such materials are $Ta_2O_5$, $(Ba,Sr)TiO_3$ (BST or BSTO), $BaTiO_3$, $SrTiO_3$, $PbZr_{1-x}Ti_xO_3$ (PZT), $PbZrO_3$, $Pb_{1-x}La_xTiO_3$ (PLT), $Pb_{1-x}La_x(Zr_yTi_{1-y})_{1-x/4}O_3$ (PLZT), and $SrBi_2Ta_2O_9$ (SBT).

In another embodiment, a layer of an electrically conducting material, which is both a barrier to oxygen diffusion and a barrier to silicon or tungsten diffusion, is located at the top surface of the conductive plug. The diffusion barrier material may or may not be etch-resistant. Examples of possible barrier materials include TiN, $Ta_{1-x}Si_xN_y$ (with 0<x<1 and y>1), and similar materials. Alternatively, this electrically conducting barrier material may be located at the bottom surface of the conductive plug, or replace the conductive plug entirely.

In yet another embodiment of the electrical device of the present invention, the first or second electrodes further include additional dielectric layers on or above their top surfaces, an example being excess second dielectric material left over from filling the gaps between the first and second electrodes.

In another variation, one or more additional dielectric layers may be placed between the first insulating material and the first (plate) electrode to function as an etch-stop, buffer layer, or adhesion promoter. One or more of these additional dielectric layers could be formed from a material such as $SiO_2$ or $SiN_x$, from an etch-resistant material such as $Al_2O_3$ or $HfO_2$, or from a material which might or might not be identical to the second dielectric material.

One electrical device made in accordance with the present invention is a capacitor having any of the cross-sectional structures described above where the sidewall gap filled with the second dielectric material may have the form of a circle, oval, hollow cross, etc.

In such a capacitor, the sidewall gap can have a width in the range 300–1200 Å and a height between 500 Å and 3 $\mu$m, preferably between 1000 Å and 1 $\mu$m. Additional devices formed by the structures described above include a capacitive memory element for DRAM, and a ferroelectric memory element for NVRAM or FRAM.

A method for fabricating the structures above in which the first and second electrodes are deposited at the same time may consist of the following process steps:

a) blanket deposition of an electrically conducting seed or "plating base" layer by a process selected from the group consisting of sputtering, evaporation, electroless deposition, or any other physical or chemical deposition process;

b) application and patterning of a first disposable material to define and temporarily fill the region that will later be the gap between the electrodes;

c) electroplating regions not covered by the first disposable material with an electrically conductive material ("third conductive layer"), which may or may not be the same as the plating base material, to form first (or plate) and second (or stack) electrodes;

d) removing the first disposable material from the gap between the newly formed electrodes; and e) electrically isolating the plated plate and stack electrode structures which are still electrically connected by the plating base remaining at the base of the gap between the electrodes.

Electrical isolation can be achieved either by removing the plating base between the formed plate and stack electrodes, or by rendering it insulating. This portion of the plating base may be removed by a process selected from the group consisting of ion beam sputtering, RIE, and any other physical etching or chemical etching/reaction technique. Alternatively, said portion of the plating base may be rendered insulating by a process such as oxidation, anodization, etc.

Thereafter a non-conformal process such as sol-gel or a conformal process such as chemical vapor deposition is used to deposit a second dielectric material to fill the gaps between the plate and stack electrodes.

An alternative method for fabricating the structures described above allows one of the electrodes to be deposited after the deposition of the second dielectric. In this process, (i) the gap filled by the second dielectric material is first defined by a temporary sidewall spacer, and (ii) the second dielectric material is deposited between a first electrode and a temporary "dummy electrode." This method (when used in the plate electrode first, stack electrode last variation) has the advantages that electrode/contact material reactions are minimized (since the electrode adjacent to the contact plug material is formed after cell dielectric deposition) and that plug oxidation and cell dielectric/plug reactions are minimized (since the plug is protected by the material of the temporary dummy electrode during cell dielectric deposition).

The method includes blanket deposition of the third conducting material, an optional third dielectric material which may also function as a polish or etch-stop, and an optional first disposable material, by processes selected from the group consisting of sputtering, evaporation, or any other physical or chemical deposition process; anisotropic etching of the layered stack to leave a structure having the lateral dimensions of the plate (or stack) electrode by a process selected from the group consisting of RIE, ion beam etching, etc.; forming sidewall spacers from a readily etched second disposable material which may or may not be the same as the first disposable material, on the exposed vertical surfaces of the layered stack containing the formed plate (or stack) electrode; conformally depositing a third disposable material having the property of being resistant to the etching conditions used to remove the first and second disposable materials, to a thickness approximately equal to the layered stack thickness; planarizing the third disposable material to expose the second disposable material by a process such as CMP; removing the second and first disposable materials by a process such as wet etching, leaving the third disposable material; filling the gap between the plate (or stack) electrode and the third disposable material with the second dielectric material; planarizing the second dielectric material to expose the third disposable material; and replacing the third disposable material with a fourth conducting material, which may or may not be the same as the third conducting material, to make the stack (or plate) electrode.

In one embodiment, the first and second disposable materials are $SiO_2$, and the third disposable material is silicon nitride. Alternatively, the first and second disposable materials are silicon nitride, and the third disposable material is $SiO_2$. Also, the third dielectric material, which can also function as a polish or etch-stop, can be $Al_2O_3$. In addition, the second electrode to be deposited can consist of one or more materials, one of which may or may not be TiN. Also, the third dielectric material can be a multilayer of one or more dielectric materials.

Turning now to the drawings, several embodiments of the structure and method of fabrication of the present invention are shown, in which like numerals will be used to represent like elements. FIG. 1(a) shows a cross-sectional view of one embodiment of the present invention. The capacitor structure 100 of this embodiment consists of a first or plate electrode 1 which surrounds a second or stack electrode 2. The first electrode 1 is separated from the second electrode 2 by a narrow gap filled with the capacitor dielectric 3. A conducting plug 4 embedded in a dielectric 5 provides contact to electrically conducting regions 6 on a substrate 20. The embodiment of FIG. 2 is similar to that of FIG. 1(a), differing only in that structure 102 includes the addition of a conductive barrier layer 7 at the top of the plug 4. The purpose of this barrier layer is to prevent out-diffusion of plug material into the electrode material, and to protect the plug material from reactions with oxygen. The remaining embodiments are illustrated only for the case of no barrier layer, but a barrier layer may be included in each if desired.

FIGS. 1(b) and 1(c) are top views of two embodiments illustrating variations in the manner in which first electrode 1 surrounds second electrode 2. The shape of the gap filled by dielectric 3 may be any shape as may be necessary according to the application and particular device being formed.

The structure 104 of FIG. 3 is an embodiment that is similar to that of FIG. 1(a), but differs in the presence of additional capacitor dielectric material 3 over the plate and stack electrodes. FIG. 4 shows a structure 106 similar to that of FIG. 3, differing only in that the top surface of the stack electrode 2 extends above the height of the plate electrode 1 and is approximately even with the capacitor dielectric material 3 overlying the plate electrode. In this embodiment, the lateral extent of the stack electrode is defined in a self-aligned process (e.g., chemical mechanical polishing). FIG. 5 shows a structure 108 similar to that of FIG. 4, differing only in that the lateral dimensions of the stack electrode's top surface are defined by a non-self aligned etching process.

The key process step in the fabrication of these capacitors is the filling of a pre-formed gap with the capacitor dielectric material, where the width of the gap defines the thickness of the capacitor dielectric. The gap may be formed between the first and second electrodes that will be in the final structure, or between one or more sacrificial materials and a single first or second electrode. Such a process allows one to sidestep the requirement that the capacitor dielectric be deposited by a conformal process such as chemical vapor deposition. A suitable deposition process for the embodiments of FIGS. 1–5 would be sol-gel deposition.

FIGS. 6–8 show the key steps for three methods of forming the gap structures that are filled with the capacitor dielectric in the fabrication of the capacitors of FIGS. 1–5. FIGS. 6(a)–6(g) show a plating method for forming a gap surrounded by both plate and stack electrodes. FIG. 6a shows a conductive plating base layer 8 deposited on a substrate 20 consisting of a conductive region 6, dielectric layer 5, plug material 4, and barrier material 7. FIG. 6b shows the structure after the deposition and patterning of disposable structures 9 to define and temporarily fill the region that will later be the gap between the plate and stack electrodes. Disposable structures 9 are preferably insulating and should have a thickness that exceeds the thickness desired for the electrodes. FIG. 6c shows the structure after electroplating plate 1 and stack 2 electrodes. FIG. 6d shows the structure after removal of the disposable material, and FIG. 6e shows the structure after the removal of the exposed plating base. As shown in FIGS. 6(*f*) and 6(*g*), the capacitor dielectric 3 is deposited and planarized as desired to make the structures of FIGS. 2 or 3.

Disposable structures 9 used to define and temporarily fill the regions between the electrodes may be deposited as a substantially planar layer and patterned after deposition. The disposable structures may be, for example, a resist layer patterned by optical, x-ray, ion-beam, e-beam, or other lithography methods, or one or more layers patterned by combinations of lithography and etching.

Figure 6M:
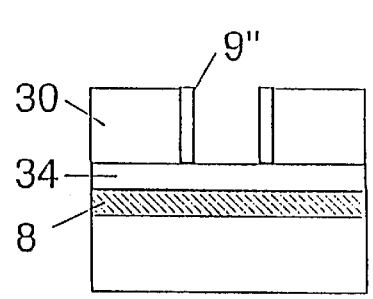
Figure 6N:
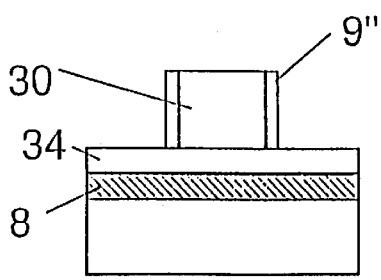
Figure 6O:
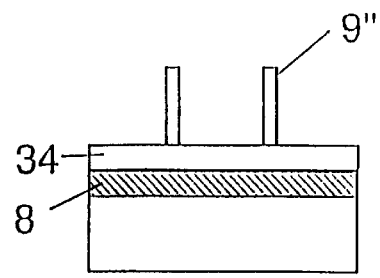
Figure 6P:
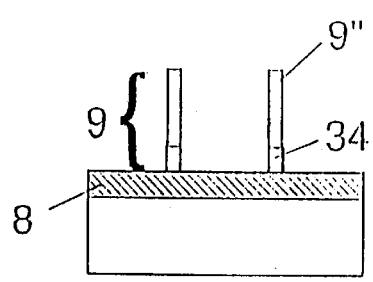
Figure 7A:
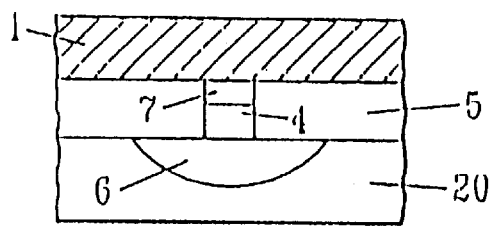
FIGS. 7(a)–7(f) are cross-sectional views depicting various stages of an alternative method of fabricating a structure similar to that of FIG. 6(e).
Figure 7B:
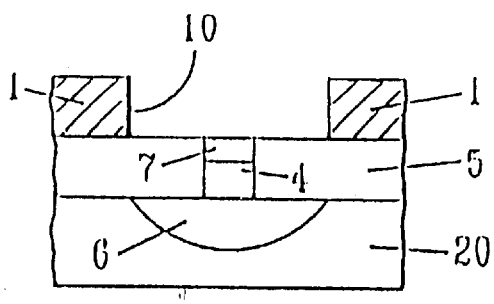
Figure 7C:
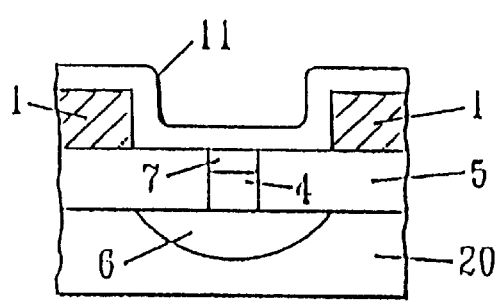
Figure 7D:
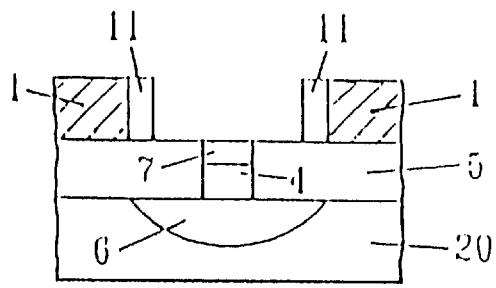
Figure 7E:
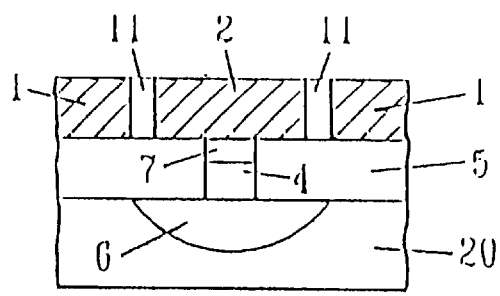
Figure 7F:
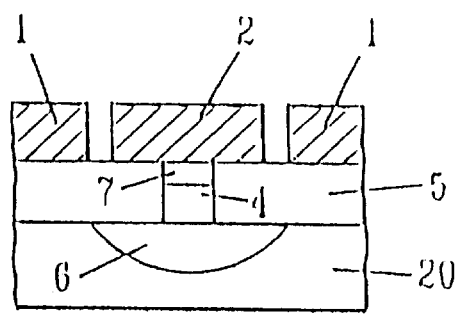
Figure 8A:
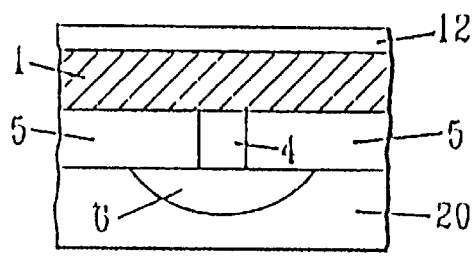
Figure 8D:
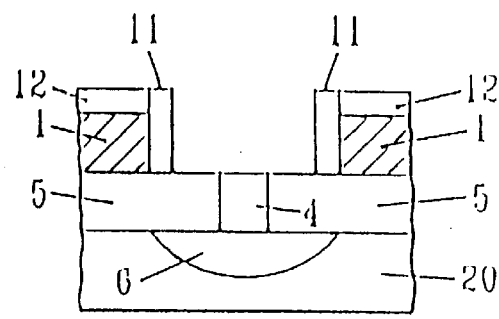
Figure 8B:
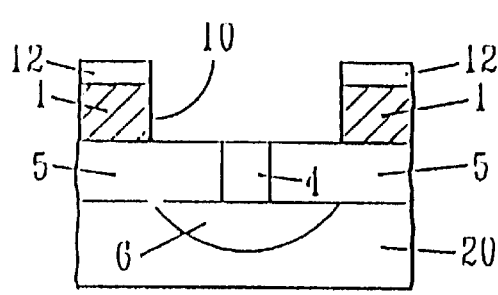
Figure 8E:
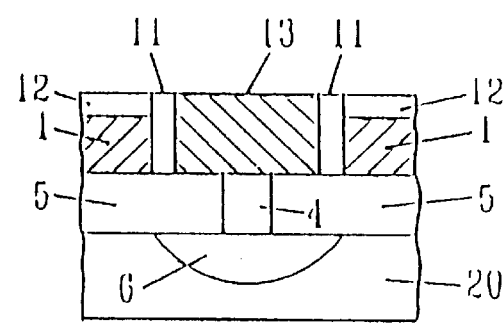
Figure 8C:
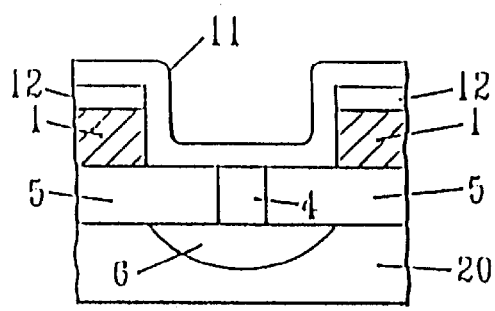
Figure 8F:
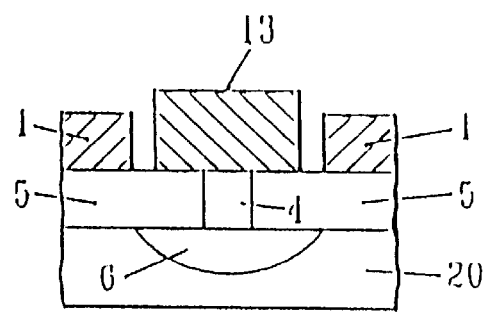

Alternatively, disposable structures 9 may be formed from sidewall spacers deposited on a temporary mandrel layer, as shown in FIGS. 6*h*–6*p*. One or more mandrel layers 30' are first deposited on plating base layer 8 (FIG. 6*h*) and patterned to form the structure of FIG. 6*i* or 6*j*. If desired, this step may be preceded by deposition of one or more optional underlayers 34 for adhesion or to protect the plating base during processing. A layer of disposable material 9' is then deposited as a conformal coating on the structure of FIG. 6*i* or 6*j* to form the structures of FIG. 6*k* or 6*l*. Disposable layer 9' should have a thickness that approximately matches the desired gap width. Disposable layer 9' is then anisotropically etched by a process such as reactive ion etching or ion beam etching to form sidewall spacers 9" (FIG. 6*m* or 6*n*). Mandrel 30 is then removed by a process such as reactive ion etching, ashing, or wet etching to produce the structure of FIG. 6*o*, or in the absence of said optional one or more underlayers 34, the structure of FIG. 6*b*. The structure of FIG. 6*p*, functionally equivalent to the structure of FIG. 6*b*, is produced by removing the exposed regions of said one or more optional underlayers 34. The optimum combinations of disposable, mandrel, and optional underlayer materials depend on the plating base composition and the chemistry of the plating solution. Preferred combinations include (i) an organic disposable material, a $SiO_2$-like mandrel material and a $SiN_x$-like underlayer material, and (ii) an organic mandrel, a $SiO_2$-like or $SiN_x$-like disposable material, and no optional underlayer.

FIGS. 7(*a*)–7(*f*) (adapted from prior art) describe a temporary sidewall spacer method for forming a gap surrounded by plate and stack electrodes. The method is illustrated for the case of structures having the electrode and substrate geometries of FIGS. 1–6. FIG. 7*a* shows the deposition of a first electrode material 1 on a substrate 20 consisting of a conductive region 6, dielectric layer 5, plug material 4, and barrier material 7. FIG. 7*b* shows the structure after an etching step to form a cavity 10. FIG. 7*c* shows the structure after conformal deposition of a temporary spacer layer 11; FIG. 7*d* shows the structure after the temporary spacer layer has been anisotropically etched to form temporary sidewall spacers 11. FIG. 7*e* shows the structure after deposition and plarlarization of the second electrode material 2. FIG. 7*f* shows the structure after removal of the temporary spacer 11. The capacitor dielectric is then deposited and planarized as desired to make the structures of FIGS. 2 or 3.

FIG. 8 describes an alternative temporary sidewall spacer method which consists of forming both a gap surrounded by a plate or stack electrode and a temporary "dummy" electrode 13. The dummy electrode is replaced with the final electrode after deposition of the capacitor dielectric. The method is illustrated for the case in which the plate electrode is deposited first, but the order could be reversed. FIG. 8*a* shows the deposition of a first electrode material 1 and an overlayer of an additional disposable material 12 on a substrate 20 consisting of a conductive region 6, dielectric layer 5, and plug material 4. FIG. 8*b* shows the structure after an etching step to form a cavity 10. FIG. 8*c* shows the structure after conformal deposition of a temporary spacer layer 11; FIG. 8*d* shows the structure after the temporary spacer layer 11 has been anisotropically etched to form sidewall spacers 11. FIG. 8*e* shows the structure after deposition and planarization of the dummy electrode material 13. FIG. 8*f* shows the structure after removal of temporary material 12 and temporary spacer 11. After deposition of capacitor dielectric 3 (FIG. 8*g*), the structure is planarized to expose the dummy electrode 13 (FIG. 8*h*). The dummy electrode 13 is then removed (FIG. 8*i*) and replaced with the final electrode material 2 to make the structures of FIG. 8*j* or 8*k*, which correspond to FIGS. 4 and 5, respectively.

While the invention has been particularly shown and described with respect to preferred embodiments thereof, it will be understood by those skilled in the art that the foregoing and other changes in form and details may be made therein without departing from the spirit and scope of the invention.

Having thus described our invention, what we claim as new, and desire to secure by Letters Patent is:

1. A method for fabricating an electrical device comprising the steps of:

forming a first conductive region in a substrate from a first conductive material;

forming a first dielectric layer above said substrate, said first dielectric layer having a first opening above some portion of said first conductive region, said first opening being substantially filled with a second conductive material;

depositing an electrically conducting blanket seed layer or plating base on said first dielectric layer;

applying and patterning a first disposable material to define spaced temporary fill regions;

electroplating conductive regions not covered by the first disposable material with a third conductive material to form first and second electrodes;

removing the first disposable material to form a gap between said first and second electrodes;

electrically isolating the first and second electrodes by removing the portions of the seed layer or plating base remaining at the base of the gap between the electrodes; and filling said gap with a second dielectric material.

2. The method of claim 1 wherein said first disposable material is a resist layer patterned by optical, x-ray, e-beam or ion beam lithography methods.

3. The method of claim 1 wherein said first disposable material comprises one or more layers patterned by combinations of lithography and etching.

4. The method of claim 1 wherein at least some of the first disposable material is formed from one or more sidewall spacers.

5. The method of claim 4 wherein said sidewall spacers are formed by:

depositing one or more optional adhesion/protection layers on a plating base or seed layer;

depositing one or more layers of mandrel material;

patterning said one or more layers of mandrel material by removing said mandrel material from a first set of areas and leaving said mandrel material in a second set of areas, said mandrel material in said second set of areas having approximately vertical sidewalls at locations desired for said sidewall spacers;

conformally depositing a layer of sidewall spacer material on said first and second set of areas and mandrel sidewalls;

anisotropically etching said sidewall spacer material so that said sidewall spacer material only remains on sidewalls of said mandrel material as sidewall spacers;

removing said mandrel material; and removing said one or more optional adhesion/protection layers from regions not covered by said sidewall spacers to expose said plating base or seed layer.

6. The method of claim 1 wherein the remaining seed layer between the first and second electrodes is removed by an etching process selected from the group consisting of wet etching, ion beam sputtering or RIE.

7. The method of claim 1 wherein the seed layer between the first and second electrodes is made to become insulating by a process of oxidation or anodization.

8. The method of claim 1 wherein the seed layer or plating base is deposited by a process selected from the group consisting of sputtering, evaporation or electroless deposition.

9. The method of claim 1 wherein the second dielectric layer is comprised of one of a ferroelectric or a high-epsilon material.

10. A method for fabricating an electrical device comprising the steps of:

forming a first conductive region in a substrate from a first conductive material;

forming a first dielectric layer above said substrate, said first dielectric layer having a first opening above some portion of said first conductive region, said first opening being substantially filled with a second conductive material;

blanket depositing a third conducting material, a third dielectric material, and a first disposable material to form a layered stack on said first dielectric layer;

anisotropic etching the layered stack to form an opening in said layered stack and to leave a structure having the lateral dimensions of a first electrode;

forming temporary sidewall spacers from a readily etched second disposable material in said opening on exposed interior vertical surfaces of the stack containing the first electrode;

conformally depositing a third disposable material in said opening having the property of being resistant to the etching conditions used to remove the first and second disposable materials, to a thickness approximately equal to the stack thickness;

planarizing the third disposable material to expose the second disposable material;

removing the first and second disposable materials leaving the third disposable material wherein a gap between the electrode stack and the third disposable material is provided;

filling the gap between the electrode stack and the third disposable material with a second dielectric material;

planarizing the second dielectric material to expose the third disposable material; and replacing the third disposable material with a fourth conducting material to make a second electrode.

11. The method of claim 10 wherein the first and second disposable materials are $SiO_2$, and the third disposable material is silicon nitride or TiN.

12. The method of claim 10 wherein the first and second disposable materials are silicon nitride or TiN, and the third disposable material is $SiO_2$.

13. The method of claim 10 wherein the third dielectric material functions as one of a polish or etch-stop.

14. The method of claim 10 wherein the second electrode consists of one or more conductive materials.

15. The method of claim 10 wherein the third dielectric material is a multilayer of one or more dielectric materials.

* * * * *